(12) United States Patent
Hwang et al.

(10) Patent No.: US 10,950,541 B2
(45) Date of Patent: Mar. 16, 2021

(54) SEMICONDUCTOR DEVICE

(71) Applicant: Samsung Electronics Co., Ltd., Suwon-si (KR)

(72) Inventors: Soon Gyu Hwang, Seongnam-si (KR); Kyoung Woo Lee, Hwaseong-si (KR); YoungWoo Cho, Suwon-si (KR); Il Sup Kim, Suwon-si (KR); Su Hyun Bark, Suwon-si (KR); Young-Ju Park, Suwon-si (KR); Jong Min Baek, Seoul (KR); Min Huh, Seoul (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 0 days.

(21) Appl. No.: 16/441,042

(22) Filed: Jun. 14, 2019

(65) Prior Publication Data

US 2020/0219808 A1    Jul. 9, 2020

(30) Foreign Application Priority Data

Jan. 4, 2019  (KR) .................. 10-2019-0001238

(51) Int. Cl.
| | |
|---|---|
| *H01L 23/48* | (2006.01) |
| *H01L 23/522* | (2006.01) |
| *H01L 21/768* | (2006.01) |
| *H01L 23/528* | (2006.01) |
| *H01L 23/532* | (2006.01) |

(52) U.S. Cl.
CPC .... *H01L 23/5226* (2013.01); *H01L 21/76831* (2013.01); *H01L 21/76832* (2013.01); *H01L 23/5283* (2013.01); *H01L 23/53238* (2013.01)

(58) Field of Classification Search
CPC .......... H01L 23/5226; H01L 21/76831; H01L 21/76832; H01L 23/5283; H01L 23/53238
See application file for complete search history.

(56) References Cited

U.S. PATENT DOCUMENTS

| | | | |
|---|---|---|---|
| 6,395,627 B1 | 5/2002 | Hoshino et al. | |
| 6,433,428 B1 | 8/2002 | Watanabe et al. | |
| 9,412,648 B1* | 8/2016 | Shiu ................. | H01L 21/76816 |
| 9,508,647 B2 | 11/2016 | Chen et al. | |
| 2006/0141772 A1 | 6/2006 | Koh | |

(Continued)

FOREIGN PATENT DOCUMENTS

| | | |
|---|---|---|
| JP | 2000-114259 A | 4/2000 |
| JP | 2006-216690 A | 8/2006 |
| KR | 1020020094520 A | 2/2007 |

(Continued)

*Primary Examiner* — Victor A Mandala
*Assistant Examiner* — Colleen E Snow
(74) *Attorney, Agent, or Firm* — Muir Patent Law, PLLC

(57) ABSTRACT

A semiconductor device includes a substrate, a first lower wiring line on the substrate, a first insulation layer on the first lower wiring line, a first dielectric barrier layer and a first etch stop layer sequentially stacked on the first insulation layer, a second insulation layer on the first etch stop layer, a first upper wiring line extending through the second insulation layer, the first etch stop layer, and the first dielectric barrier layer, and a first conductive via in the first insulation layer and electrically connecting the first lower wiring line and the first upper wiring line. An upper surface of the first conductive via protrudes above a lower surface of the first upper wiring line.

15 Claims, 21 Drawing Sheets

(56) References Cited

U.S. PATENT DOCUMENTS

2008/0064221 A1   3/2008   Han et al.
2013/0234279 A1*  9/2013   Kim .................. H01L 21/76232
                                                              257/491

FOREIGN PATENT DOCUMENTS

KR   1020040000181 A   5/2008
KR   1020080057941 A   8/2008

* cited by examiner

SEMICONDUCTOR DEVICE

CROSS-REFERENCE TO RELATED APPLICATION

This application claims priority under 35 U.S.C. § 119 to Korean Patent Application No. 10-2019-0001238 filed on Jan. 4, 2019 in the Korean Intellectual Property Office, the disclosure of which is hereby incorporated by reference in its entirety.

BACKGROUND

Technical Field

Example embodiments of the present disclosure relate to a semiconductor device.

Discussion of Related Art

With development of electronic technology, a size of semiconductor devices has been scaled-down, and thus semiconductor devices require high integration and lower power consumption.

To meet such high integration and lower power consumption, wiring lines in semiconductor devices are designed to have lower resistance and improved electromigration resistance. In addition, structures and arrangements of the wiring lines for minimizing a resistance between the wiring lines are desirable.

SUMMARY

According to example embodiments of the inventive concepts, a semiconductor device may include a substrate, a first lower wiring line on the substrate, a first insulation layer on the first lower wiring line, a first dielectric barrier layer and a first etch stop layer sequentially stacked on the first insulation layer, a second insulation layer on the first etch stop layer, a first upper wiring line extending through the second insulation layer, the first etch stop layer, and the first dielectric barrier layer, and a first conductive via in the first insulation layer and electrically connecting the first lower wiring line and the first upper wiring line An upper surface of the first conductive via may protrude above a lower surface of the first upper wiring line.

According to example embodiments of the inventive concepts, a semiconductor device may include a substrate, a first lower wiring line on the substrate, a first insulation layer on the first lower wiring line, a first dielectric barrier layer and a first etch stop layer sequentially stacked on the first insulation layer, a second insulation layer on the first etch stop layer, a first upper wiring barrier film extending along a sidewall and a lower surface of a first upper wiring trench in the second insulation layer, the first etch stop layer, and the first dielectric barrier layer, and at least part of the first insulation layer, and a first via barrier film connected to the first upper wiring barrier film and extending along a sidewall and a lower surface of a first via trench in the first insulation layer and below the first upper wiring trench. A portion of the first upper wiring barrier film may be upwardly curved in a direction away from the substrate.

According to example embodiments of the inventive concepts, a semiconductor device may include a substrate, a first lower wiring line on the substrate, a first insulation layer on the first lower wiring line, a first dielectric barrier layer and a first etch stop layer sequentially stacked on the first insulation layer, a second insulation layer on the first etch stop layer, a first upper wiring line extending through the second insulation layer, the first etch stop layer, and the first dielectric barrier layer and into the first insulation layer, and a first conductive via in the first insulation layer and electrically connecting the first lower wiring line and the first upper wiring line. A portion of an upper surface of the first conductive via may protrude above a portion of lower surface of the first upper wiring line. The first upper wiring line may extend into an upper half of the first insulation layer and does not extend to a lower half of the first insulation layer.

DETAILED DESCRIPTION

Various example embodiments will now be described more fully with reference to the accompanying drawings in which some example embodiments are shown. However, the inventive concepts may be embodied in many alternate forms and should not be construed as limited to only example embodiments set forth herein.

Figure 1:
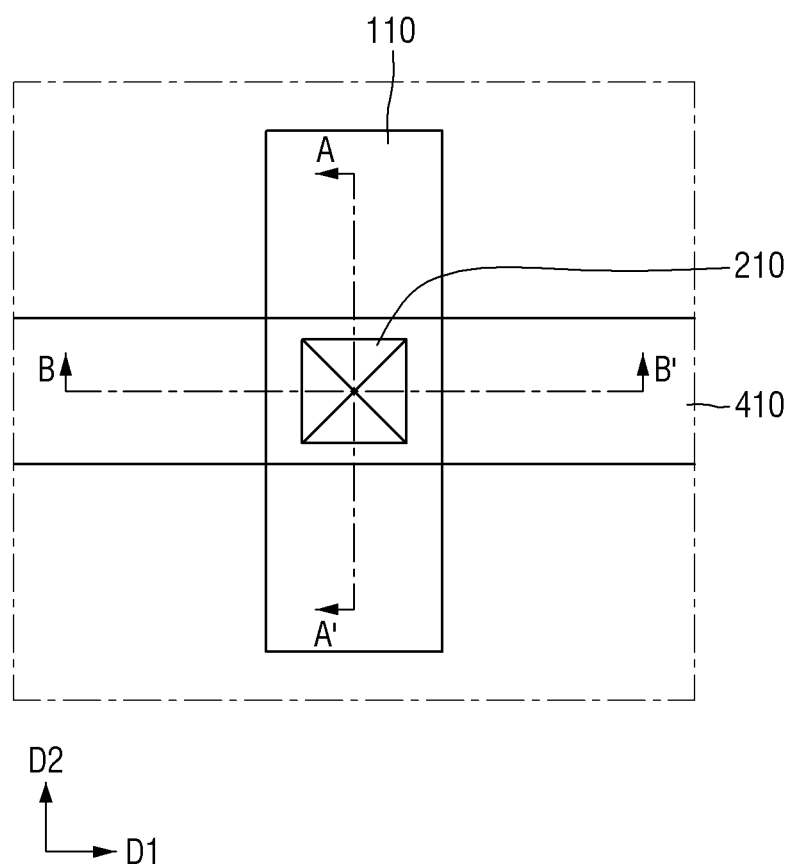
FIG. 1 is a layout diagram illustrating a semiconductor device according to example embodiments of the inventive concept.
Figure 2:
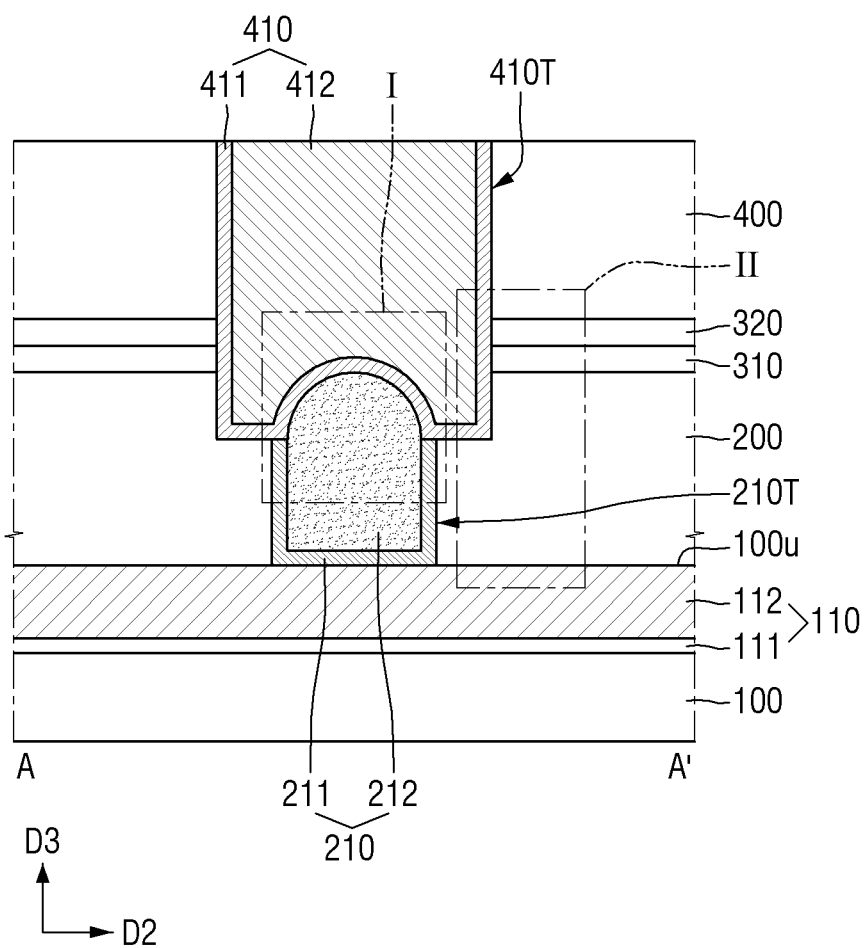
FIG. 2 is a cross-sectional view taken along line A-A' of FIG. 1, according to example embodiments of the inventive concept.
Figure 3:
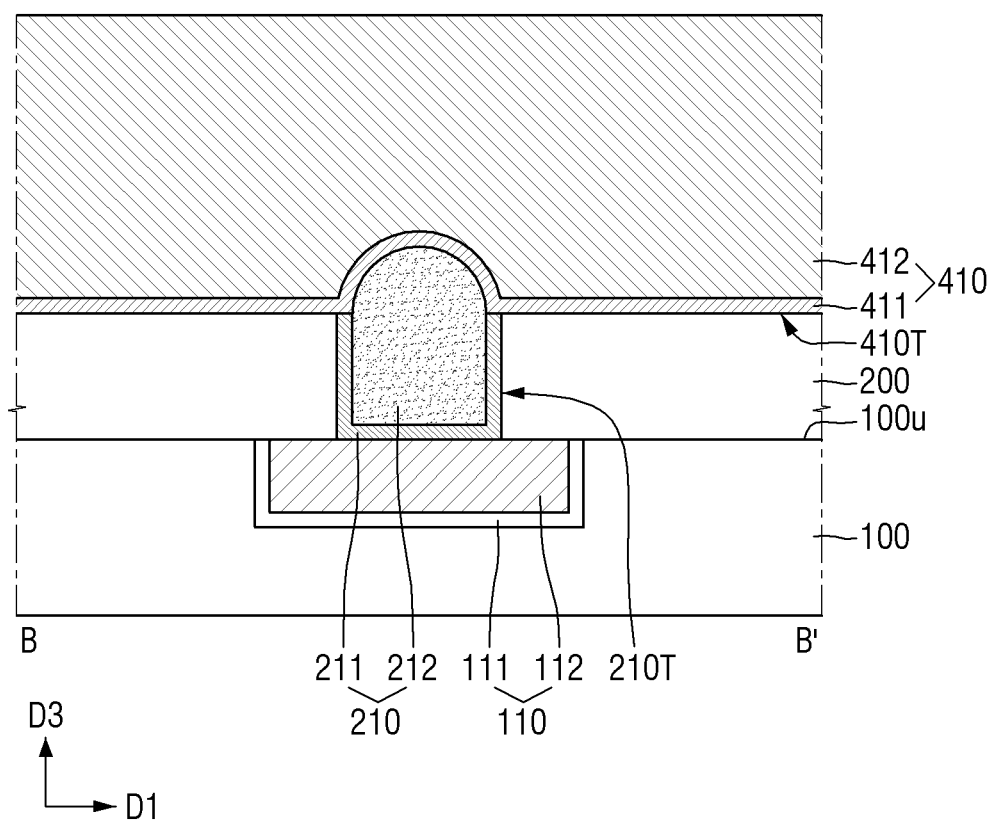
FIG. 3 is a cross-sectional view taken along line B-B' of FIG. 1, according to example embodiments of the inventive concept.

FIG. 1 is a layout diagram illustrating a semiconductor device according to example embodiments of the inventive concept. FIG. 2 is a cross-sectional view taken along line A-A' of FIG. 1, according to some embodiments. FIG. 3 is a cross-sectional view taken along line B-B' of FIG. 1, according to some embodiments.

As used herein, a semiconductor device may refer, for example, to a device such as a semiconductor chip (e.g., memory chip and/or logic chip formed on a die), a stack of semiconductor chips, a semiconductor package including one or more semiconductor chips stacked on a package substrate, or a package-on-package device including a plurality of packages. These devices may be formed using ball grid arrays, wire bonding, through substrate vias, or other electrical connection elements, and may include memory devices such as volatile or non-volatile memory devices. Semiconductor packages may include a package substrate, one or more semiconductor chips, and an encapsulant formed on the package substrate and covering the semiconductor chips. In some embodiments, the structures shown in FIGS. 1-13 are part of a semiconductor chip or semiconductor package.

Referring to FIGS. 1 to 3, a semiconductor device according to example embodiments of the inventive concept may include a substrate 100, a first lower wiring line 110, a first via 210, a first dielectric barrier layer 310, a first etch stop layer 320, and a first upper wiring line 410.

Spatially relative terms, such as "beneath," "below," "lower," "above," "upper" and the like, may be used herein for ease of description to describe positional relationships, such as illustrated in the figures, e.g. It will be understood that the spatially relative terms encompass different orientations of the device in addition to the orientation depicted in the figures.

In some embodiments, the first lower wiring line 110 and the first upper wiring line 410 may extend across each other. For example, the first lower wiring line 110 may have a long side extending in a second direction D2 and a short side extending in a first direction D1. The first upper wiring line 410 may extend lengthwise along the first direction D1 in which the short side of the first lower wiring line 110 extends. An item, layer, or portion of an item or layer described as extending "lengthwise" in a particular direction has a length in the particular direction and a width perpendicular to that direction, where the length is greater than the width. The first via 210 may be disposed at a region in which the first upper wiring line 410 and the first lower wiring line 110 overlap each other in plan view and may extend in a third direction D3. For example, the first direction D1 and the second direction D2 may be parallel to an upper surface 100u of the substrate 100. For example, the third direction D3 may be a direction away from or perpendicular to the upper surface 100u of the substrate 100. The first, second, third directions D1, D2 and D3 may cross one another.

The substrate 100 may have a structure in which a base substrate and an epitaxial layer are stacked, but the structure is not limited thereto. The substrate 100 may be, for example, a silicon substrate, a gallium arsenide substrate, a silicon germanium substrate, a ceramic substrate, a quartz substrate, or a display glass substrate. The substrate 100 may be a silicon on insulator (SOI) substrate. Hereinafter, the substrate 100 may refer to a silicon substrate, for example. The substrate 100 may be a structure in which an insulation layer is formed on the silicon substrate.

The substrate 100 may include the first lower wiring line 110. In some embodiments, the first lower wiring line 110 may be a metal line, but it is not limited thereto. The first lower wiring line 110 may be formed on the substrate 100 (e.g., on at least a portion of the substrate disposed below the first lower wiring line 110). In some embodiments, the first lower wiring line 110 may be, for example, a part of or connected to a transistor or a diode formed in the substrate 100. For example, in one embodiment, the first lower wiring line 110 may be a gate electrode or may be connected to a source/drain of the transistor. Also, though a first lower wiring line 110 is shown and described below, in some cases, item 110 may represent a source/drain of a transistor, and thus a bottom of the first via 210 described below may contact a source/drain of a transistor in the substrate 100.

The first lower wiring line 110 may include a first lower wiring barrier film 111 and a first lower wiring film 112. The first lower wiring barrier film 111 and the first lower wiring film 112 may include a conductive material.

The first lower wiring barrier film 111 may be formed between the first lower wiring film 112 and the substrate 100. The first lower wiring barrier film 111 may extend along an inner surface of a recess formed in the substrate 100. The first lower wiring barrier film 111 may be formed of a single layer or multiple layers.

The first lower wiring barrier film 111 may include, for example, at least one of tantalum, tantalum nitride, titanium, titanium nitride, ruthenium, cobalt, nickel, nickel boron (NiB), and tungsten nitride, but is not limited thereto.

The first lower wiring film 112 may fill the recess with the first lower wiring barrier film 111, in the substrate 100.

The first lower wiring film 112 may include, for example, aluminum, copper, tungsten, cobalt, or a combination thereof.

A capping layer may be disposed on a portion of an upper surface of first lower wiring line 110. For example, the capping layer may protrude over the upper surface 100u of the substrate 100. An etch stop layer may be disposed on the upper surface 100u of the substrate 100 including the first lower wiring line 110. The etch stop layer may include a portion of a first via trench 210T penetrating the etch stop layer.

The first insulation layer 200 may be disposed on the substrate 100. The first insulation layer 200 may include, for example, at least one of silicon oxide, silicon nitride, silicon oxynitride, and a low-k dielectric material.

The first dielectric barrier layer 310 may be disposed on the first insulation layer 200. For example, the first dielectric barrier layer 310 may include at least one of SiN, SiCN, SiOC, SiON, SiOCN, TiO, TaO, TaTiO, TaSiO and AlO.

The first etch stop layer 320 may be disposed on the first dielectric barrier layer 310. For example, the first etch stop layer 320 may include at least one of AlOx, ZrOx, AlN and AlON.

The second insulation layer 400 may be disposed on the first etch stop layer 320. The second insulation layer 400 may include, for example, at least one of silicon oxide, silicon nitride, silicon oxynitride, and a low-k dielectric material.

The first upper wiring line 410 may include a first upper wiring barrier film 411 and a first upper wiring film 412. The first upper wiring barrier film 411 may extend along a sidewall and a lower surface of a first upper wiring trench 410T formed in the second insulation layer 400, the first etch stop layer 320, the first dielectric barrier layer 310, and the first insulation layer 200. A remaining portion of the first upper wiring trench 410T may be filled with the first upper wiring film 412.

The first upper wiring line 410 may be electrically connected to the first lower wiring line 110 through the first via 210 and may pass through the second insulation layer 400, the first etch stop layer 320, the first dielectric barrier layer 310, and the first insulation layer 200. For example, the first upper wiring line 410 may extend through the second insulation layer 400, the first etch stop layer 320, the first dielectric barrier layer 310 and into the first insulation layer 200. The first upper wiring line 410 may extend into the first insulation layer 200 in which the first via 210 is disposed.

The first via 210 may include a first via barrier film 211 and a first via material 212. The first via barrier film 211 may extend along a sidewall and a lower surface of the first via trench 210T formed in the first insulation layer 200. A remaining portion of the first via trench 210T may be filled by the first via material 212.

In some embodiments, the first upper wiring line 410 and the first via 210 may include the same material. The first upper wiring line 410 and the first via 210 may include a conductive material. The first via 210 may be referred to as a conductive via. The first upper wiring line 410 and the first via 210 may include, for example, aluminum, copper, tungsten, cobalt, or a combination thereof, but they are not limited thereto. In some embodiments, the first upper wiring line 410 and the first via 210 may include different materials.

In some embodiments, the first via 210 electrically connects the first lower wiring line 110 and the first upper wiring line 410. In some embodiments, an upper surface of the first via 210 protrudes above a lower surface of the first upper wiring line 410.

Figure 4:
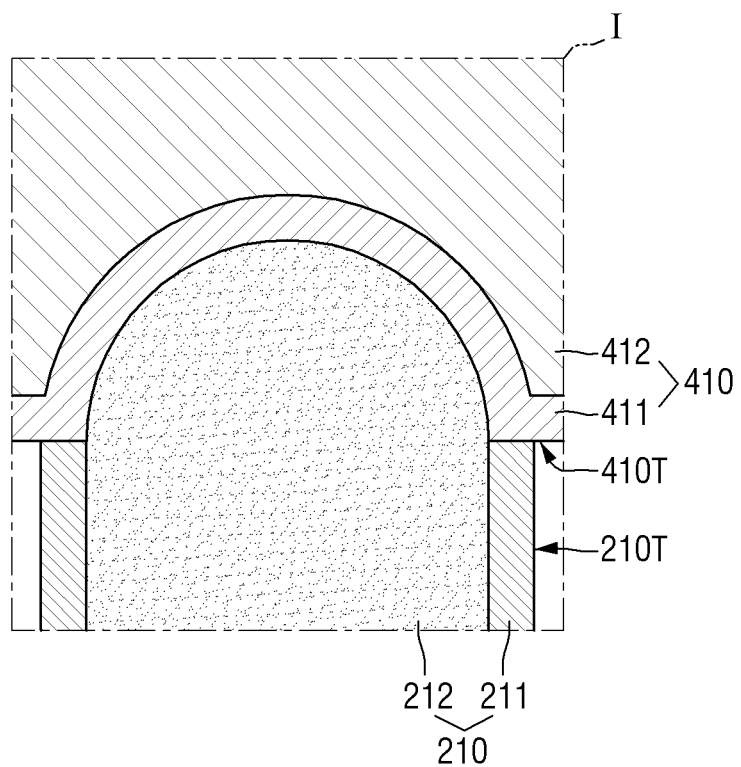
FIG. 4 is an enlarged view of portion I of FIG. 2.

FIG. 4 is an enlarged view of portion I of FIG. 2.

Referring to FIGS. 2 and 4, as shown in the drawings, a portion of the first via 210 protrudes from the lower surface of the first upper wiring line 410 in the third direction D3. In this embodiment, the first via 210 and the first upper wiring line 410 overlap each other in a plan view. A protruding upper portion of the first via 210 may be covered by the first upper wiring line 410.

In some embodiments, the first upper wiring barrier film 411 is connected to the first via barrier film 211, and contacts the first via barrier film 211. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact. A portion of the first upper wiring barrier film 411 may be curved upward on a lower surface of the first upper wiring trench 410T. For example, a portion of the first via 210 may protrude from the lower surface of the first upper wiring line 410 in the third direction D3, such that the portion of the first upper wiring barrier film 411 extending along the upper surface of the first via 210 may be convexly curved (or have a convex shape) in a direction away from the substrate 100.

The first via trench 210T may be formed in the first insulation layer 200, and then the first via barrier film 211 and the first via material 212 may sequentially fill the first via trench 210T. Thereafter, the first upper wiring trench 410T may be formed in the second insulation layer 400. The first upper wiring trench 410T may be more deeply formed to pass through the first etch stop layer 320, the first dielectric barrier layer 310, and a portion of the first insulation layer 200. The first upper wiring barrier film 411 and the first upper wiring film 412 may fill the first upper wiring trench 410T, such that the upper surface of the first via 210 protrudes over the lower (e.g., bottom) surface of the first upper wiring line 410 in the third direction D3.

Figure 5:
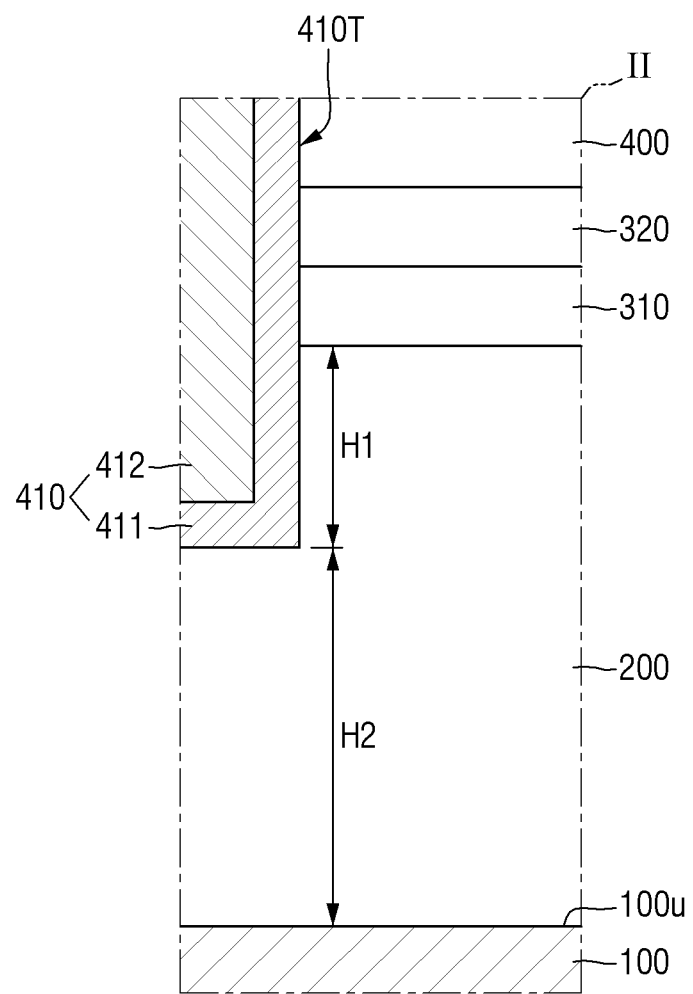
FIG. 5 is an enlarged view of portion II of FIG. 2.

FIG. 5 is an enlarged view of portion II of FIG. 2.

Referring to FIGS. 2 and 5, the first upper wiring line 410 may further extend downwardly from an upper surface of the first insulation layer 200. Thus, the first upper wiring line 410 may have a first depth H1 in the third direction D3 in the first insulation layer 200 (i.e., may extend by the first depth H1 below a top surface of the first insulation layer 200). In some embodiments, the first depth H1 may be smaller than a second depth H2. H2 may be obtained by subtracting the first depth H1 from a height (or thickness) of the first insulation layer 200 (e.g., between topmost and bottommost surfaces) in the third direction D3. In the first insulation layer 200, the first depth H1 of a region where the first upper wiring line 410 occupies may be smaller than the second depth H2 of another region under the region occupied by the first upper wiring line 410. For example, the first upper wiring line 410 may extend into an upper half of the first insulation layer 200 without extending into a lower half of the first insulation layer 200. In some embodiments, the first depth H1 may range from 2 nm to 10 nm.

In some embodiments, H1 may correspond to and may be equal to the relative height (or distance) the uppermost portion of first via material 212 is above a lowermost portion of the first upper wire barrier film 411. H2 may correspond to and may be equal to the relative height (or distance) that the lowermost portion of first upper wire barrier film 411 is above upper surface 100u of the first lower wiring line 110 and/or the uppermost portion of lower wire film 112. Likewise, a combined relative height (or distance) of H1 plus H2 may correspond to and be equal to a relative height (or distance) between upper surface 100u of the first wiring line 110 and/or the uppermost portion of lower wire film 112 and the uppermost portion of first via material 212.

In some embodiments, H1 may be equal to the distance the uppermost portion of first via material 212 is above the first upper wire barrier film 411. Terms such as "equal," "same," "flat," or "coplanar," as used herein encompass near identicality or flatness including variations that may occur, for example, due to manufacturing processes. The term "substantially" may be used herein to emphasize this meaning, unless the context or other statements indicate otherwise.

According to example embodiments of the inventive concept, as the upper wiring trench in which the upper wiring line is formed extends into the lower insulation layer in which the lower via is formed and the lower via protrudes upwardly from the lower surface of the upper wiring trench, the lower surface of the upper wiring line may be formed in a convex shape (or the upper wiring barrier film formed to be convexly curved) in a direction away from the substrate 100. Therefore, a contact area between the upper wiring line and the lower via may be increased. In this case, compared to a conventional structure in which a lower surface of an upper wiring line is flat on a lower via, an interfacial resistance between the upper wiring line and the lower via which each include a conductive material may be reduced. Thus, the conduction loss between the upper wiring and the lower via (or the lower wiring line) may be reduced, and thus the conduction efficiency and reliability may be improved. As shown in FIG. 2, a lower surface of the first via 210, e.g., where it contacts the first lower wiring line 110, may be substantially flat and may not extend into the first wiring line 110, and an upper surface of the first via 210, e.g., where it contacts the first upper wiring line 410 may have a curved profile and may extend into a recess formed in the first upper wiring line 410. As described above, the first via 210 may protrude between 2 nm and 10 nm above a bottommost surface of the first upper wiring line 410.

Figure 6:
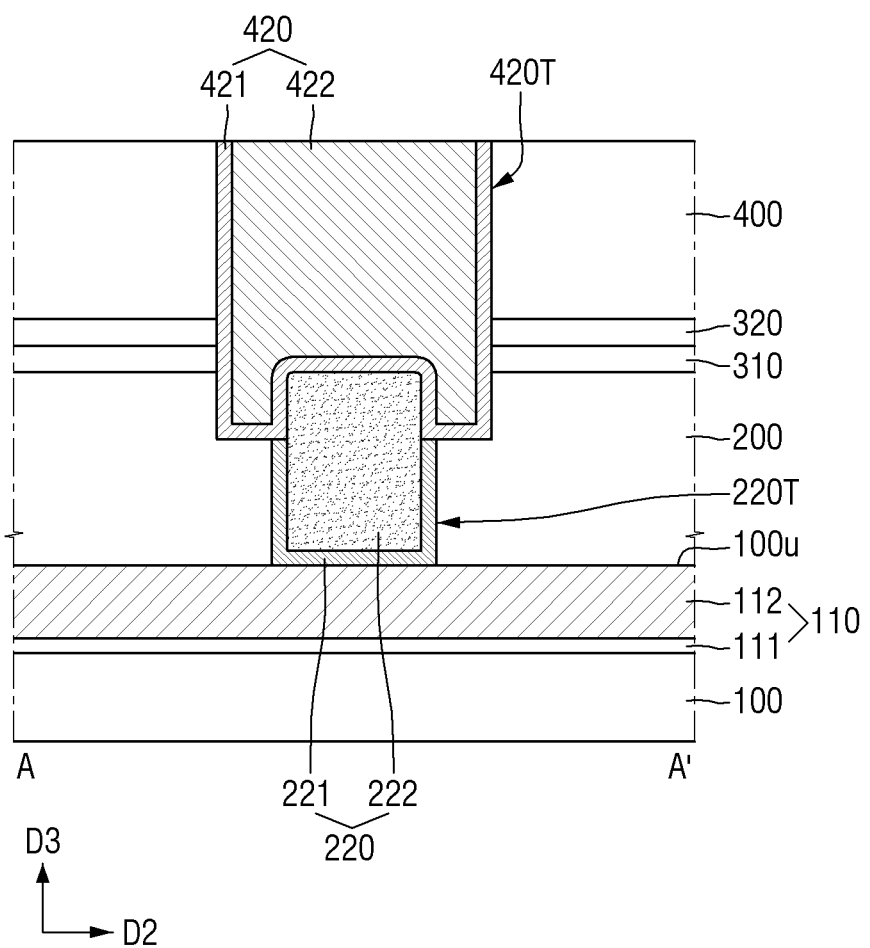
FIG. 6 is a cross-sectional view taken along line A-A' of FIG. 1, according to example embodiments of the inventive concept.

FIG. 6 is a cross-sectional view taken along line A-A' of FIG. 1, according to some example embodiments.

Referring to FIG. 6, in some embodiments, an upper portion of a lower via 220 may not be formed in a fully rounded dome shape (or a convex shape), For example, in some embodiments, only upper edges or corners of the lower via 220 may be rounded. In some embodiments, the lower via 220 may have a rectangular cross-sectional shape. The lower via 220 may be formed in a pillar shape and a portion of the lower via 220 may protrude above the lower surface of the upper wiring line 420, thus increasing the contact area between the upper wiring line 420 and the lower via 220.

Figure 7:
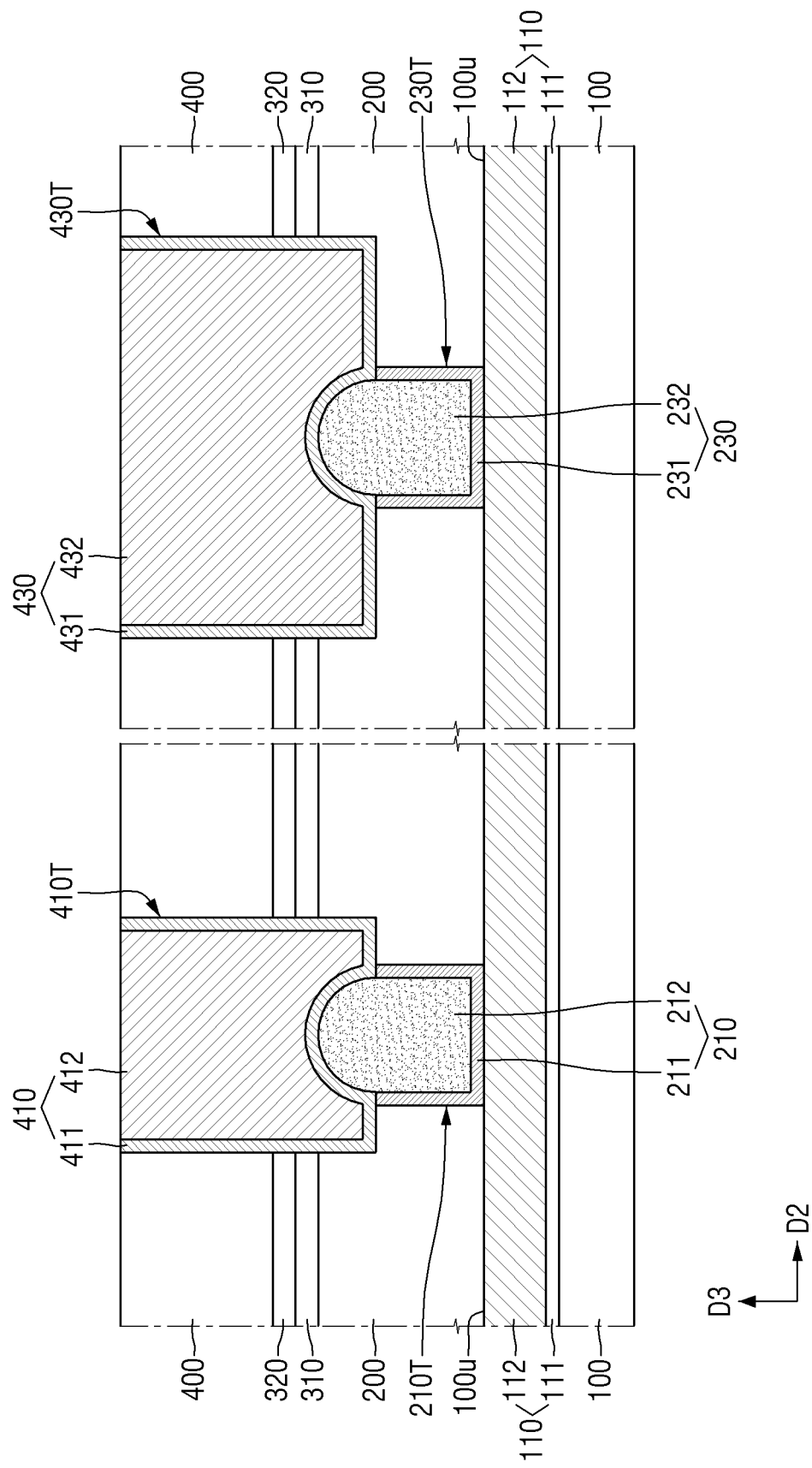
FIG. 7 is a cross-sectional view of a plurality of upper wiring lines and vias having a similar structure according to example embodiments of the inventive concept.

FIG. 7 is a cross-sectional view of a plurality of upper wiring lines and vias having a similar structure according to example embodiments of the inventive concept. A description duplicative of the embodiments described with reference to FIGS. 2 to 5 are briefly given or omitted.

Referring to FIG. 7, the first upper wiring line 410 and a second upper wiring line 430 may extend through the second insulation layer 400, the first etch stop layer 320, the first dielectric barrier layer 310 and into the first insulation layer 200. The first upper wiring line 410 and the second upper wiring line 430 may be electrically connected to the first lower wiring line 110 through the first via 210 and a second via 230, respectively. The first upper wiring line 410 and the first via 210 may have the same structure as those described with reference to FIGS. 2 to 5. The second upper wiring line 430 and the second via 230 may have a structure similar to or the same structure as the first upper wiring line 410 and the first via 210, respectively. The second via 230 may protrude above a lower surface of the second upper wiring line 430. The second via 230 and the second upper wiring line 430 may overlap each other in a plan view. A protruding upper portion of the second via 230 may be covered by the second upper wiring line 430.

The second via 230 may include a second via barrier film 231 and a second via material 232 which fill a second via trench 230T formed in the first insulation layer 200.

The second upper wiring line 430 may include a second upper wiring barrier film 431 and a second upper wiring film 432 which fill a second upper wiring trench 430T passing through the second insulation layer 400, the first etch stop layer 320, the first dielectric barrier layer 310, and a portion of the first insulation layer 200.

In some embodiments, the first upper wiring line 410 and the second upper wiring line 430 may be arranged to be electrically connected to different lower wiring lines, respectively. For example, the first upper wiring line 410 may be electrically connected to the first lower wiring line 110 through the first via 210, and the second upper wiring line 430 may be electrically connected to another lower wiring line spaced apart from the first lower wiring line 110 through the second via 230.

In some embodiments, a depth in the third direction D3 by which the first upper wiring line 410 extends into the first insulation layer 200 may be different from a depth in the third direction D3 by which the second upper wiring line 430 extends into the first insulation layer 200. In some embodiments, a depth in the third direction D3 by which the first upper wiring line 410 extends into the first insulation layer 200 may be the same as a depth in the third direction D3 by which the second upper wiring line 430 extends into the first insulation layer 200.

In some embodiments, a contact area between the first upper wiring line 410 and the first via 210 may be different from a contact area between the second upper wiring line 430 and the second via 230. In some embodiments, a contact area between the first upper wiring line 410 and the first via 210 may be the same as a contact area between the second upper wiring line 430 and the second via 230.

In the illustrated example embodiments, two vias 210 and 230 may be in the first insulation layer 200 and two upper wiring lines 410 and 430 may be in the first insulation layer 200, the first dielectric barrier layer 310, the first etch stop layer 320, and the second insulation layer 400. However, the inventive concept is not limited thereto. For example, three or more vias may be in the first insulation layer 200 and a plurality of upper wiring lines may be disposed to be connected to respective ones of the three or more vias.

Figure 8:
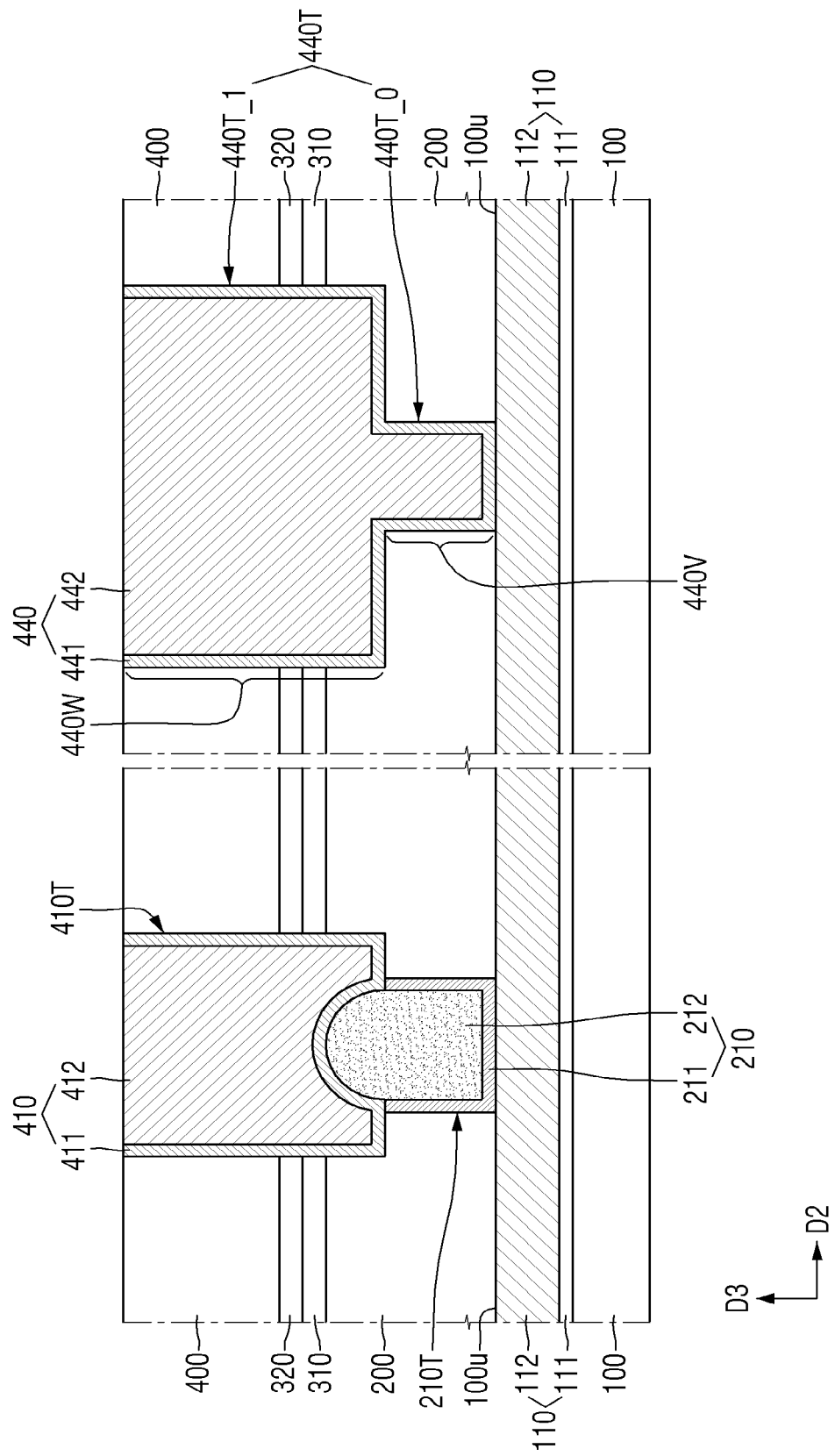
FIG. 8 is a cross-sectional view of a plurality of upper wiring lines having different structures according to example embodiments of the inventive concept.

FIG. 8 is a cross-sectional view of a plurality of upper wiring lines having different structures according to example embodiments of the inventive concept. A description of duplication with the embodiments described with reference to FIGS. 2 to 5 are briefly given or omitted.

Referring to FIG. 8, a semiconductor device according to example embodiments may further include a third upper wiring line 440 in addition to the same components as described with reference to FIGS. 2 to 5. The third upper wiring line 440 may include a third upper wiring barrier film 441 and a third upper wiring film 442. The third upper wiring barrier film 441 and the third upper wiring film 442 may fill a third upper wiring trench 440T passing through the second insulation layer 400, the first etch stop layer 320, the first dielectric barrier layer 310, and the first insulation layer 200 and reaching the first lower wiring line 110.

The third upper wiring trench 440T may include a first sub-trench 440T_0 and a second sub-trench 440T_1. The first sub-trench 440T_0 may be formed in the first insulation layer 200, and the second sub-trench 440T_1 may be formed to pass through the second insulation layer 400, the first etch stop layer 320, and the first dielectric barrier layer 310.

The third upper wiring line 440 may include a via portion 440V contacting the first lower wiring line 110 and a wiring portion 440W extending in the first direction D1. The via portion 440V of the third upper wiring line 440 may include a third upper wiring barrier film 441 and a third upper wiring film 442 which fill the first sub-trench 440T_0, and the wiring portion 440W of the third upper wiring line 440 may include the third upper wiring barrier film 441 and the third upper wiring film 442 which fill the second sub-trench 440T_1. The via portion 440V of the third upper wiring line 440 may be disposed in the first insulation layer 200, and the wiring portion 440W of the third upper wiring line 440 may be disposed to extend through the second insulation layer 400, the first etch stop layer 320, and the first dielectric barrier layer 310. The wiring portion 440W of the third upper wiring line 440 may be electrically connected to the first lower wiring line 110 through the via portion 440V of the third upper wiring line 440. In some embodiments, the third upper wiring line 440 may be electrically connected to another lower wiring line different from the first lower wiring line 110.

The third upper wiring line 440 may include copper, for example. In some embodiments, the third upper wiring line 440 may include copper and an additive material including at least one of carbon (C), silver (Ag), cobalt (Co), tantalum (Ta), indium (In), tin (Sn), zinc (Zn), manganese (Mn), titanium (Ti), magnesium (Mg), chromium (Cr), germanium (Ge), strontium (Sr), platinum (Pt), aluminum (Al), and zirconium (Zr).

The semiconductor device according to example embodiments of the inventive concept may include a plurality of wiring lines having different structures. A portion of the first upper wiring line 410 extending into the first insulation layer 200 and having a lower surface of an upwardly convex shape and the third upper wiring line 440 including the wiring portion 440W and the via portion 440V may be disposed together. Therefore, in consideration of the integration of the semiconductor device and the degree of freedom of process, the structures of the wiring lines may be formed differently in the same insulation layer.

Figure 9:
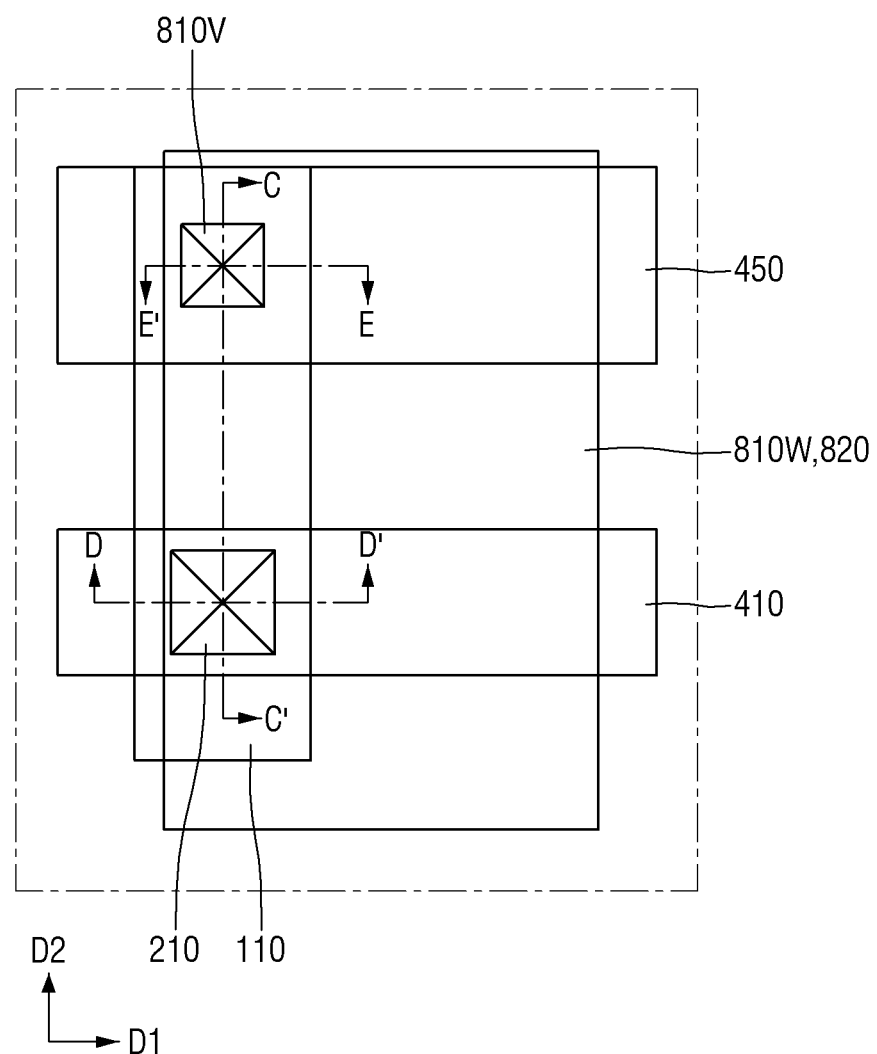
FIG. 9 is a layout diagram illustrating a semiconductor device according to example embodiments of the inventive concept.
Figure 10:
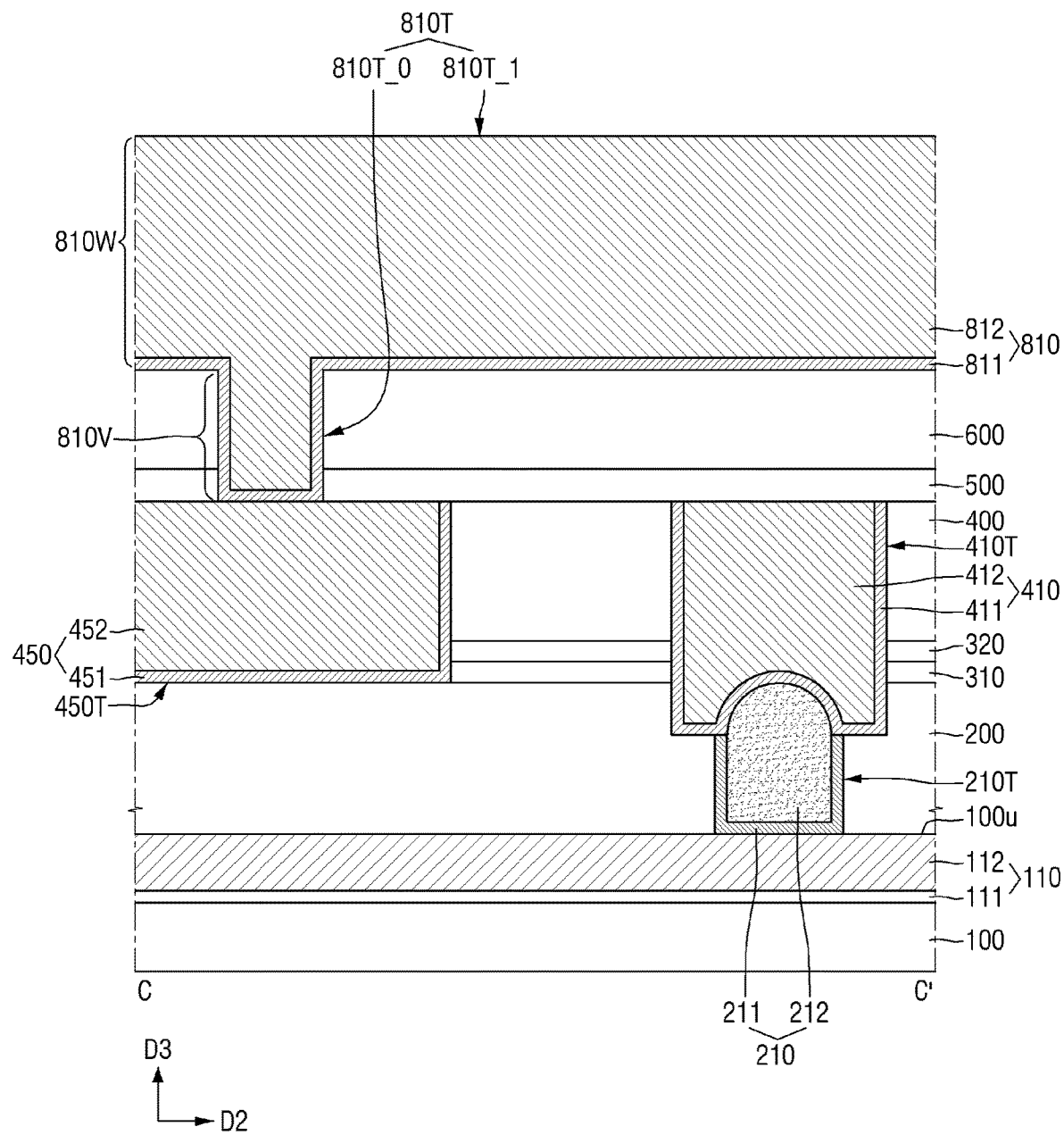
FIG. 10 is a cross-sectional view taken along line C-C' of FIG. 9, according to example embodiments of the inventive concept.
Figure 11:
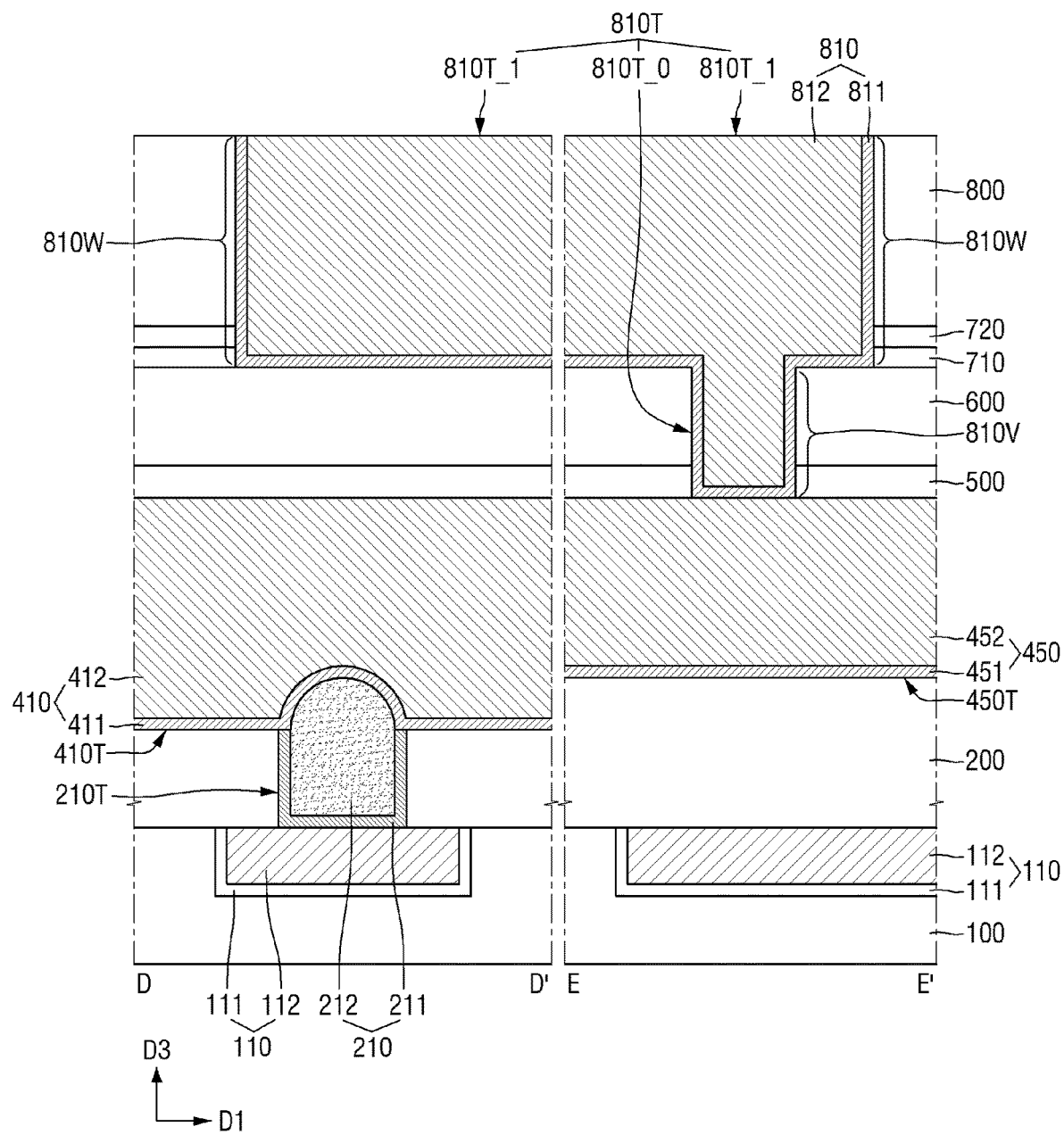
FIG. 11 is a cross-sectional view taken along lines D-D' and E-E' of FIG. 9, according to example embodiments of the inventive concept.

FIG. 9 is a layout diagram illustrating a semiconductor device according to example embodiments of the inventive concept. FIG. 10 is a cross-sectional view taken along line C-C' of FIG. 9. FIG. 11 is a cross-sectional view taken along lines D-D' and E-E' of FIG. 9, respectively. A description of duplication with the previous embodiments described with reference to FIGS. 1 to 8 are briefly given or omitted.

Referring to FIGS. 9 to 11, a semiconductor device according to example embodiments of the inventive concept may further include a fourth upper wiring line 450, a third insulation layer 600, a fourth insulation layer 800, and a fifth upper wiring line 810, in addition to the same components as described with reference to FIGS. 2 to 5. The fourth upper wiring line 450 may be disposed in the second insulation layer 400 and may be spaced apart from the first upper wiring line 410. The third insulation layer 600 and the fourth insulation layer 800 may be sequentially stacked on the second insulation layer 400. The fifth upper wiring line 810 may be disposed in the third insulation layer 600 and the fourth insulation layer 800 and may be electrically connected to the fourth upper wiring line 450. An etch stop layer 500 may be interposed between the second insulation layer 400 and the third insulation layer 600. A second dielectric barrier layer 710 and a second etch stop layer 720 may be disposed between the third insulation layer 600 and the fourth insulation layer 800. The fourth upper wiring line 450 may include a fourth upper wiring barrier film 451 and a fourth upper wiring film 452 which fill a fourth upper wiring trench 450T passing through the second insulation layer 400, the first etch stop layer 320, and the first dielectric barrier layer 310.

The fifth upper wiring line 810 may include a fifth upper wiring barrier film 811 and a fifth upper wiring film 812. The fifth upper wiring barrier film 811 and the fifth upper wiring film 812 may fill a fifth upper wiring trench 810T passing through the fourth insulation layer 800, the second etch stop layer 720, the second dielectric barrier layer 710, the third insulation layer 600, and the etch stop layer 500.

The fifth upper wiring trench 810T may include a third sub-trench 810T_0 and a fourth sub-trench 810T_1. The third sub-trench 810T_0 may be formed in the third insulation layer 600 and the etch stop layer 500. The fourth sub-trench 810T_1 may be formed through the fourth insulation layer 800, the second etch stop layer 720, and the second dielectric barrier layer 710.

The fifth upper wiring line 810 may include a via portion 810V contacting the fourth upper wiring line 450 and a wiring portion 810W extending in the second direction D2. The fourth upper wiring line 450 may extend in the first direction D1, and the fifth upper wiring line 810 may extend in the second direction D2 perpendicular to the first direction D1.

The via portion 810V of the fifth upper wiring line 810 may include a fifth upper wiring barrier film 811 and a fifth upper wiring film 812 which fill the third sub-trench 810T_0, and the wiring portion 810W of the fifth upper wiring line 810 may include the fifth upper wiring barrier film 811 and the fifth upper wiring film 812 which fill the fourth sub-trench 810T_1. The via portion 810V of the fifth upper wiring line 810 may be disposed in the third insulation layer 600 and the etch stop layer 500, and the wiring portion 810W of the fifth upper wiring line 810 may be disposed in the fourth insulation layer 800, the second etch stop layer 720, and the second dielectric barrier layer 710. The wiring portion 810W of the fifth upper wiring line 810 may be electrically connected to the fourth upper wiring line 450 through the via portion 810V of the fifth upper wiring line 810.

The fourth upper wiring line 450 and the fifth upper wiring line 810 may include copper. In some embodiments, the fourth upper wiring line 450 and the fifth upper wiring line 810 may include copper and an additive material including at least one of carbon (C), silver (Ag), cobalt (Co), tantalum (Ta), indium (In), tin (Sn), zinc (Zn), manganese (Mn), titanium (Ti), magnesium (Mg), chromium (Cr), germanium (Ge), strontium (Sr), platinum (Pt), aluminum (Al), and zirconium (Zr).

The semiconductor device according to example embodiments of the inventive concept may include a plurality of wiring lines having different structures. The first upper wiring line 410 extending into the first insulation layer 200 and having the upwardly convexly shaped lower surface and the fifth upper wiring line 810 including the wiring portion 810W and the via portion 810V may be disposed together.

In the illustrated embodiments, the first upper wiring line 410 and the fourth upper wiring line 450 may be spaced apart from each other in the second insulation layer 400. In some embodiments, the fourth upper wiring line 450 may be replaced with the first upper wiring line 410. For example, the wiring portion 810W of the fifth upper wiring line 810 may be electrically connected to the first upper wiring line 410 through the via portion 810V of the fifth upper wiring line 810. Thus, the first upper wiring line 410 and the fifth upper wiring line 810 that have different structures may be disposed at the different layers and may be connected to each other.

The vias electrically connecting respective ones of a plurality of metal wiring lines disposed at different layers may have different sizes and different depths according to operation characteristics and structure characteristics. For example, the upper wiring line and the upper wiring via having a relatively wide width, such as the fifth upper wiring line 810, may be formed using a dual damascene process, and the lower wiring line and the lower via having a relatively narrow width, such as the first upper wiring line 410 and the first via 210, may be formed using a single damascene process. Thus, the degree of freedom of process may be improved and the interfacial resistance may be minimized. The conduction efficiency of the wiring structure and operation reliability of the semiconductor device may be improved.

Figure 12:
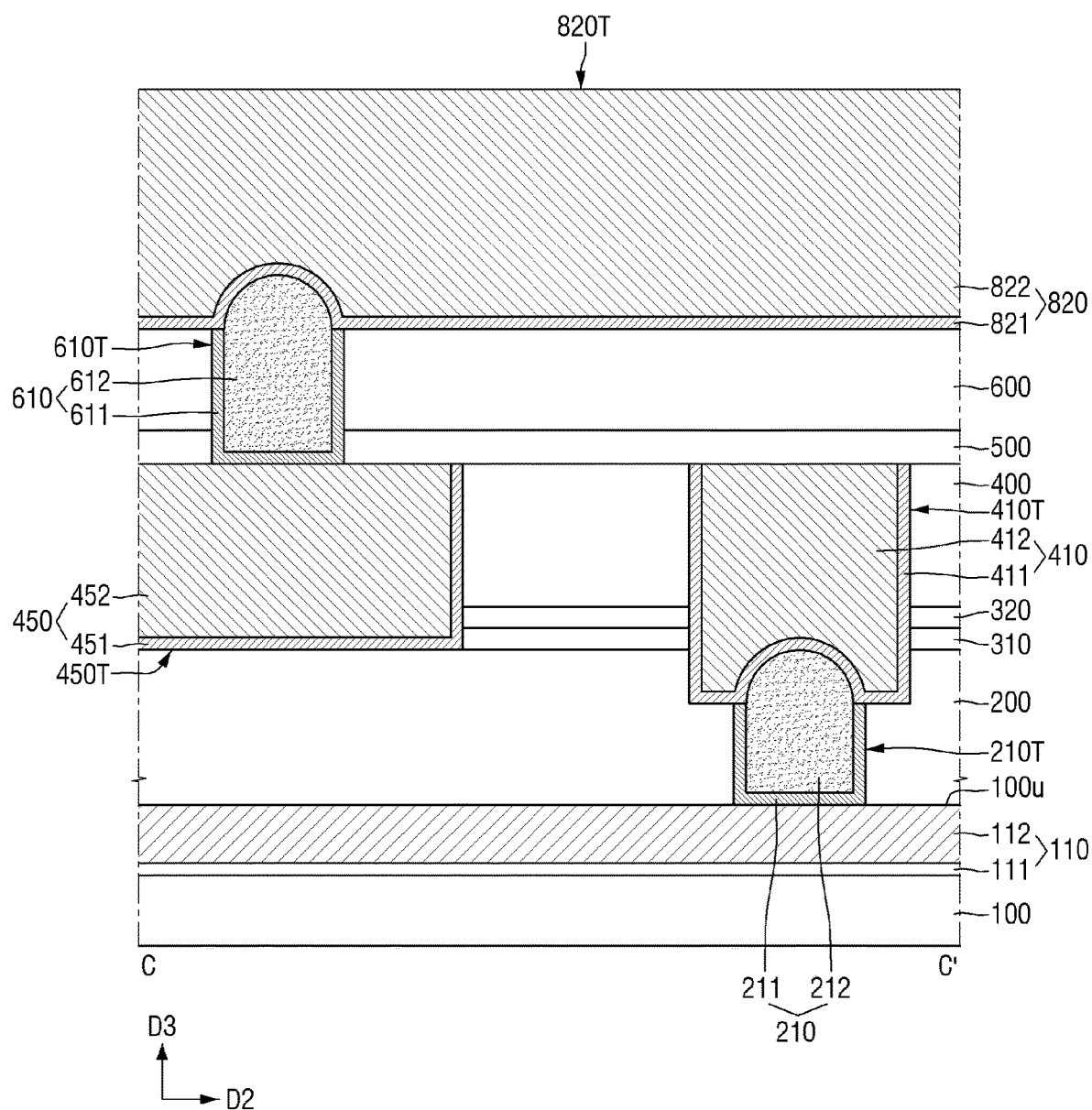
FIG. 12 is a cross-sectional view taken along line C-C' of FIG. 9, according to example embodiments of the inventive concept.
Figure 13:
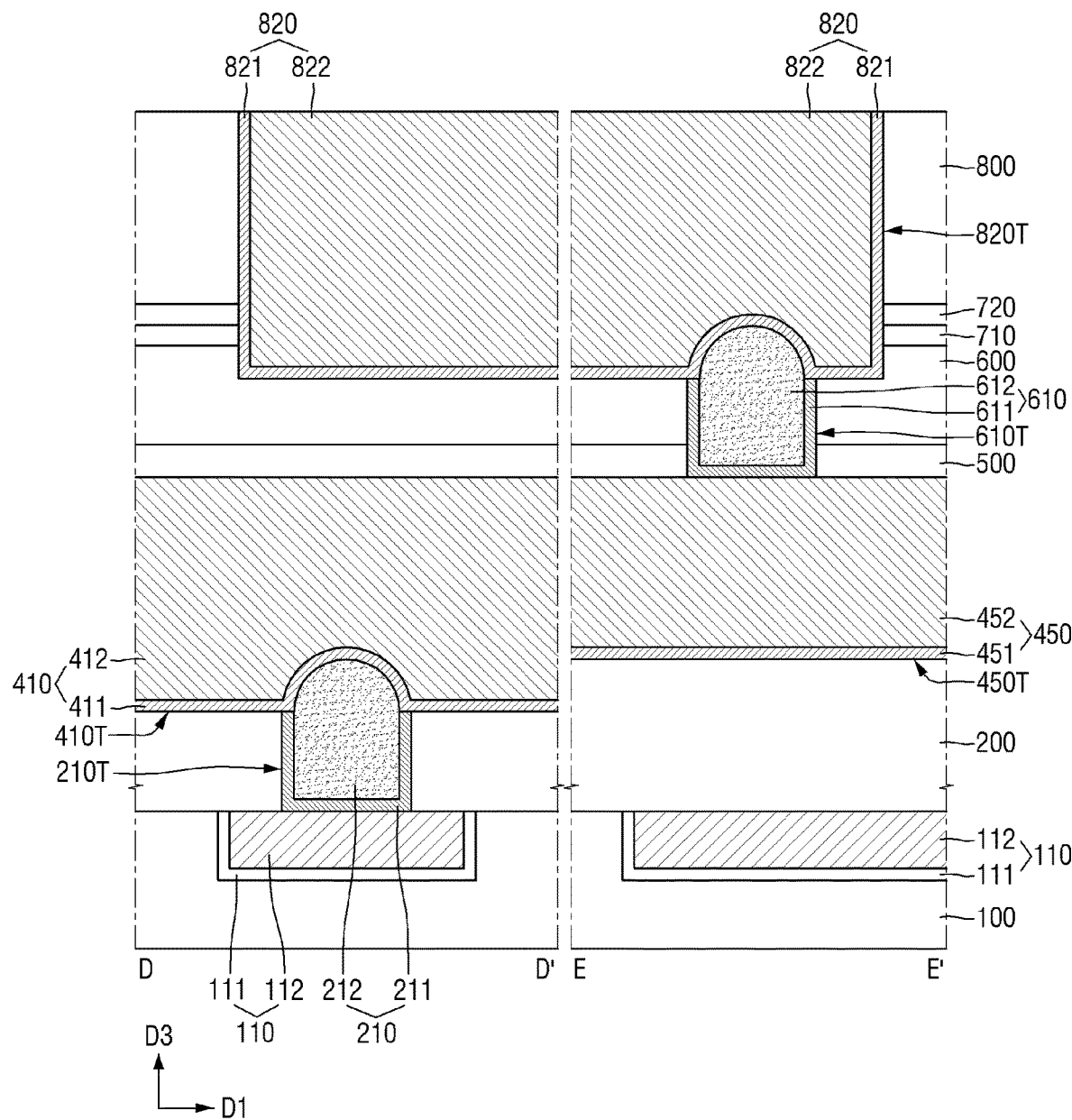
FIG. 13 is a cross-sectional view taken along lines D-D' and E-E' of FIG. 9, according to example embodiments of the inventive concept.

FIG. 12 is a cross-sectional view taken along line C-C' of FIG. 9. FIG. 13 is a cross-sectional view taken along lines D-D' and E-E' of FIG. 9.

FIGS. 9, 12, and 13, a semiconductor device according to example embodiments, in addition to the same components as described with reference to FIGS. 2 to 5, may further include the fourth upper wiring line 450 in the second insulation layer 400 and spaced apart from the first upper wiring line 410, the third insulation layer 600, the second dielectric barrier layer 710, the second etch stop layer 720, and the fourth insulation layer 800 that are sequentially stacked on the second insulation layer 400, a third via in the third insulation layer 600, a sixth upper wiring line 820 contacting an upper surface of the third via 610 and electrically connected to the fourth upper wiring line 450 through the third via 610. In this case, the third via 610 may be a substitute for the via portion 810V of the fifth upper wiring line 810 shown in FIG. 9.

The sixth upper wiring line 820 may include a sixth upper wiring barrier film 821 and a sixth upper wiring film 822 that fill a sixth upper wiring trench 620T passing through the fourth insulation layer 800, the second etch stop layer 720, the second dielectric barrier layer 710, and a portion of the third insulation layer 600.

In some embodiments, an upper surface of the third via 610 may protrude above a lower surface of the sixth upper wiring line 820 in the third direction D3. The sixth upper wiring line 820 may extend through the fourth insulation layer 800, the second etch stop layer 720, the second dielectric barrier layer 710 and into the third insulation layer 600. For example, the third via 610 and the sixth upper wiring line 820 may have the same structure as the first via 210 and the first upper wiring line 410, respectively, described with reference to FIGS. 2 to 5. The third via 610 may include a third via barrier film 611 and a third via material 612 that fill a third via trench 610T passing through the third insulation layer 600 and the etch stop layer 500.

In some embodiments, the sixth upper wiring line 820 may have the same width, for example, a length in the first direction D1 and in the second direction D2, and the same height (or thickness), for example, a length in the third direction D3 as the first upper wiring line 410. The third via 610 may have the same width and the same height as the first via 210.

In some embodiments, the sixth upper wiring line 820 may have a different structure from the first upper wiring line 410, and the third via 610 may have a different structure as the first via 210. For example, the width or the height (or thickness) of the sixth upper wiring line 820 may be different from the width or height (or thickness) of the first upper wiring line 410. The width or the height (or thickness) of the third via 610 may be different from the width or height (or thickness) of the first via 210.

As shown in FIGS. 12 and 13, the first upper wiring line 410 and the fourth upper wiring line 450 may be arranged spaced apart from each other in the second insulation layer 400. However, in some embodiments, the fourth upper wiring line 450 may be replaced with the first upper wiring line 410. Thus, the sixth upper wiring line 820 may be electrically connected to the replaced first upper wiring line 410 through the third via 610. Therefore, the first upper wiring line 410 and the sixth upper wiring line 820 that have the same structure may be disposed at different layers.

FIGS. 14 to 21 are cross-sectional views illustrating stages in a method of fabricating a semiconductor device according to example embodiments of the inventive concept.

Figure 14:
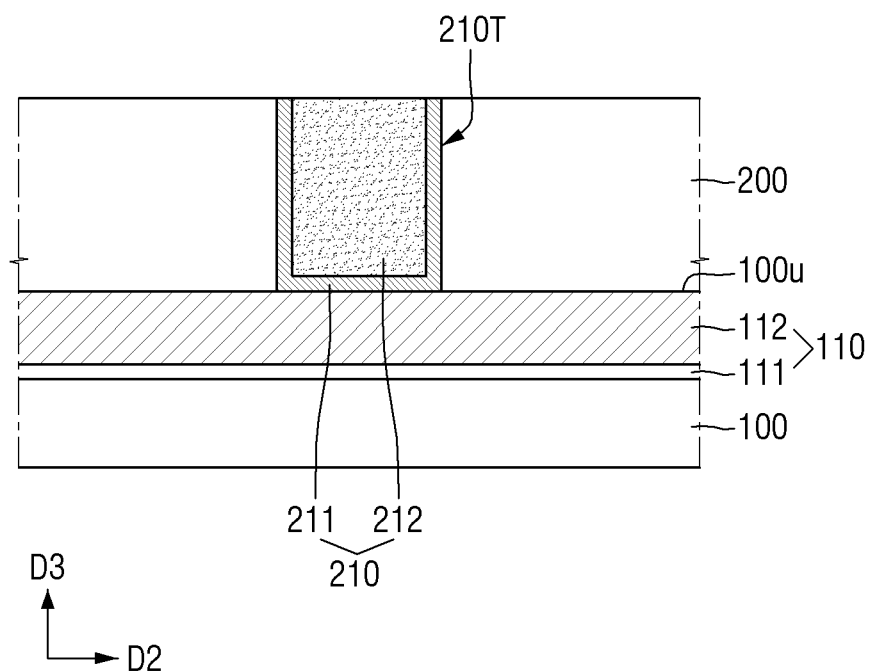
FIGS. 14 to 21 are cross-sectional views illustrating stages in a method of fabricating a semiconductor device according to example embodiments of the inventive concept.

Referring to FIG. 14, the first insulation layer 200 is formed on the substrate 100 including the first lower wiring line 110. In some embodiments, an etch stop layer may be formed between the substrate 100 and the first insulation layer 200.

The first insulation layer 200 may be formed by chemical vapor deposition (CVD), spin coating, plasma enhanced CVD, or high density plasma CVD, for example.

The first insulation layer 200 may be etched using a mask pattern as an etch mask to form the first via trench 210T in the first insulation layer 200.

The first via barrier film 211 and the first via material 212 sequentially fill the first via trench 210T and then may be planarized, such that the first via 210 is formed.

Figure 15:
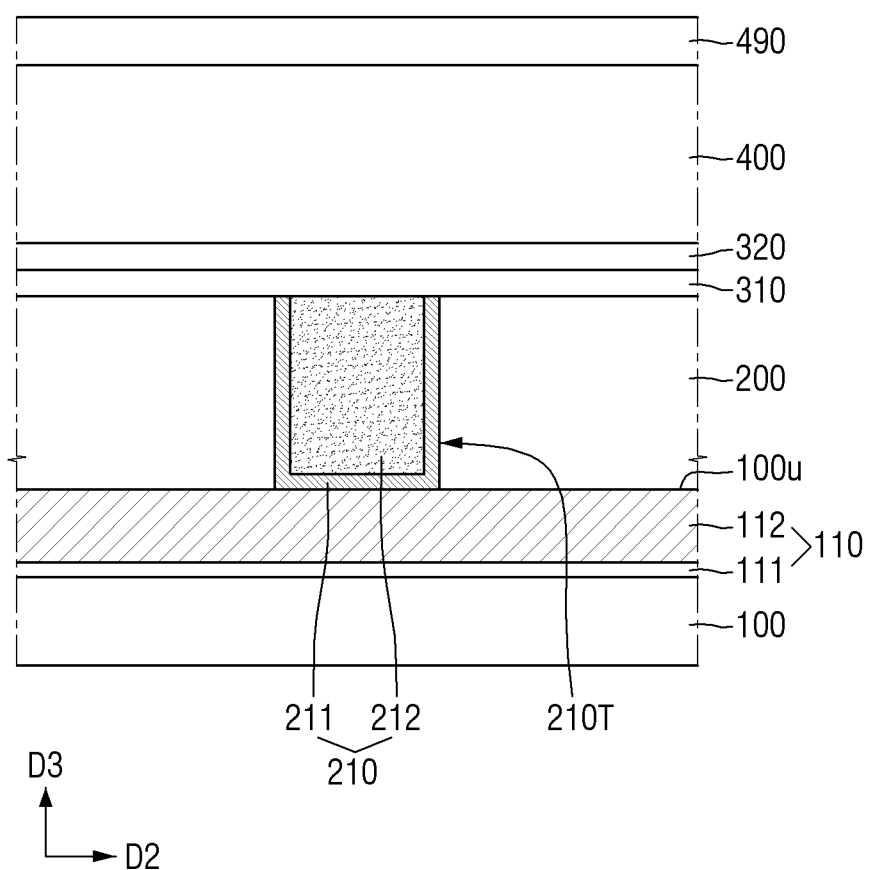
Figure 16:
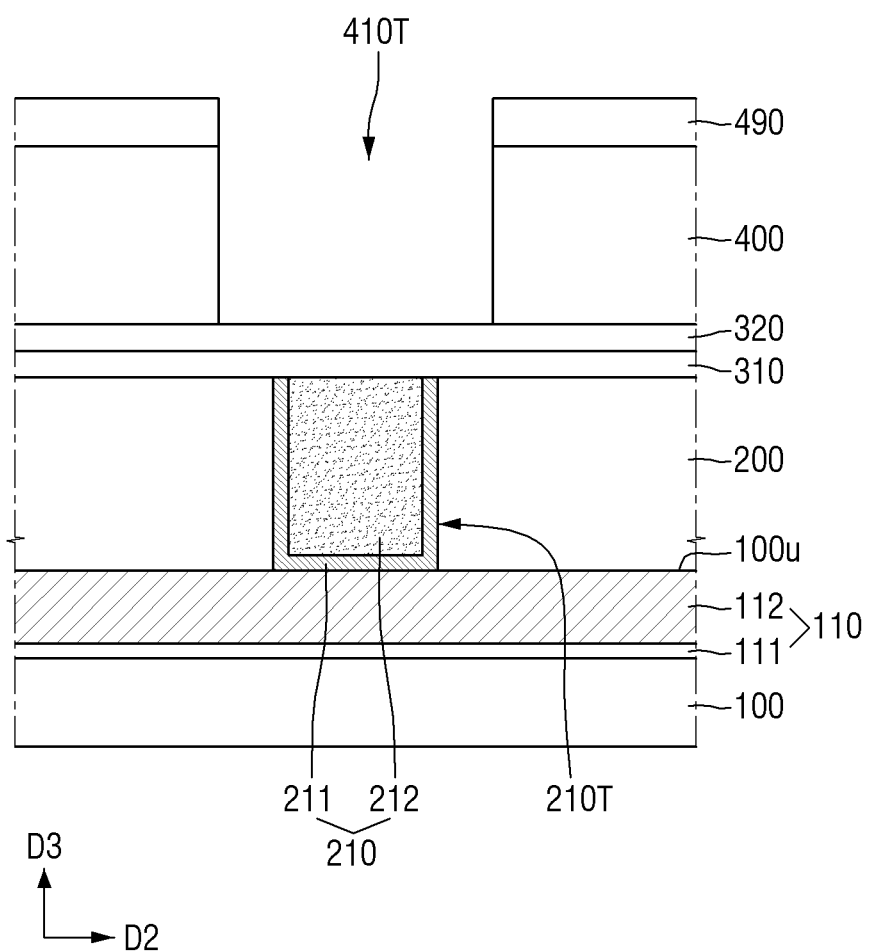

Referring to FIGS. 15 and 16, the first dielectric barrier layer 310, the first etch stop layer 320, the second insulation layer 400, and a photo resist layer 490 are sequentially formed on the first insulation layer 200. A portion of the photo resist layer 490 and a portion of the second insulation layer 400 may be etched using a hard mask pattern as an etch mask pattern to form the first upper wiring trench 410T in the second insulation layer 400. The first upper wiring trench 410T may expose the first etch stop layer 320.

Figure 17:
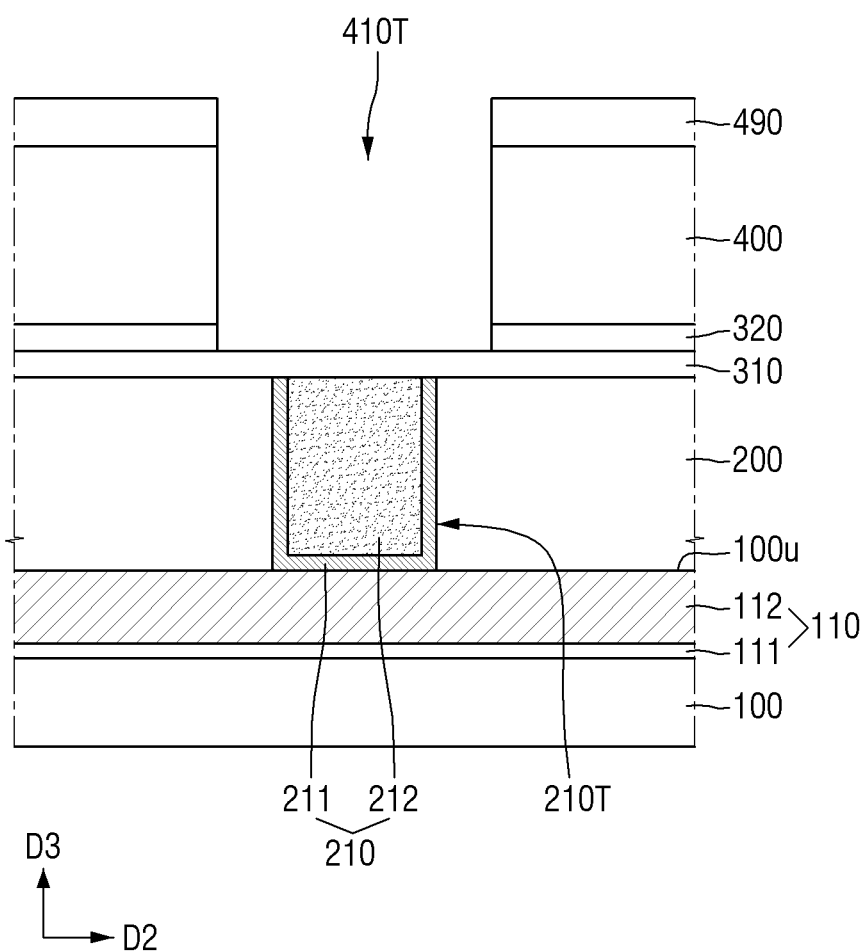

Referring to FIG. 17, the exposed first etch stop layer 320 may be removed by an etchant. The removal of the first etch stop layer 320 may be performed by a wet etching process or a dry etching process using an etching solution or an etching gas having a high selectivity with respect to the first dielectric barrier layer 310. The wet etching process may be performed using ammonia ($NH_3$)-based solution, for example, ammonium hydroxide ($NH_4OH$), or tetramethyl ammonium hydroxide (TMAH). The dry etching process may be performed using $CF4/O_2$ gas or HBR gas.

Figure 18:
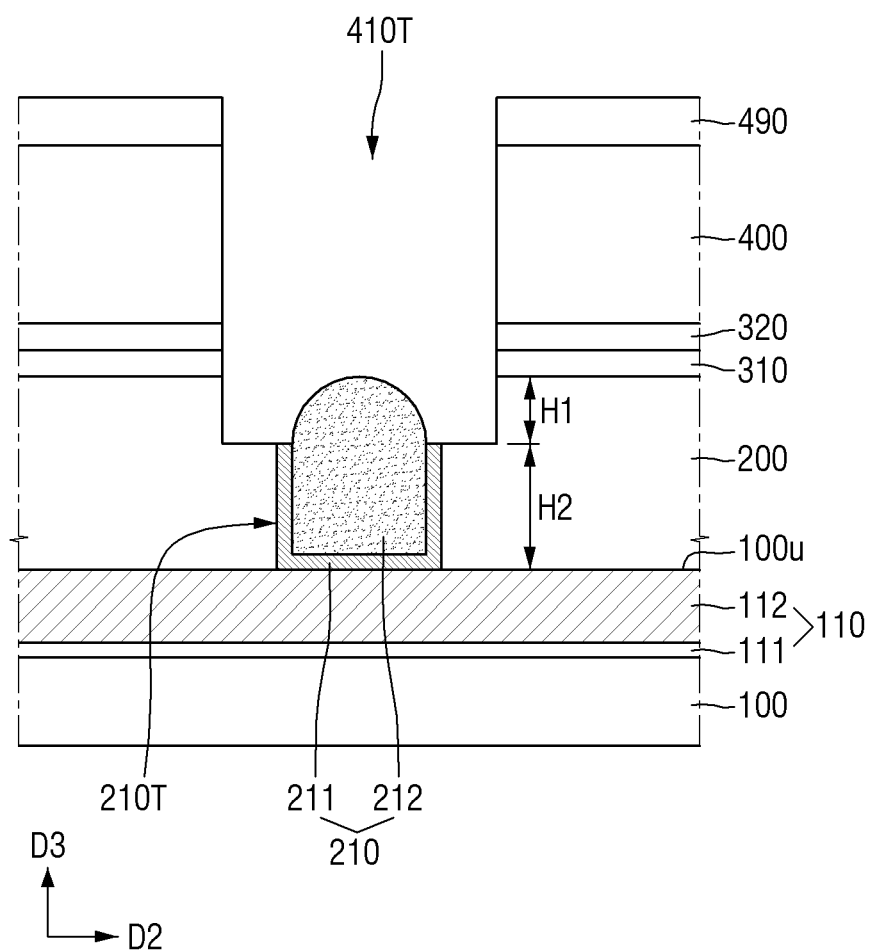

Referring to FIG. 18, the first dielectric barrier layer 310 and a portion of the first insulation layer 200 may be etched, such that the first upper wiring trench 410T is formed to extend through the second insulation layer 400 and the first etch stop layer 320, and into the first insulation layer 200. The first dielectric barrier layer 310 and the portion of the first insulation layer 200 may be etched, for example, by a dry etching process that may be performed using a fluorine (F)-, chlorine (Cl)-, or bromine (Br)-based material. For example, the process of etching the first dielectric barrier layer 310 and the first insulation layer 200 may be performed by a chemical dry etching process. The chemical dry etching process may be performed using a fluorine-based gas, for example, a $CF_4$ gas or a $CHF_3$ gas. In some embodiments, the dry etching process may be performed using a capacitively coupled plasma type etching apparatus, an inductively coupled plasma type etching apparatus, or an electron cyclotron resonance (ECR) plasma etching apparatus.

In some embodiments, in the whole height (or thickness) H1+H2 of the first insulation layer 200, the first depth H1 at which the first upper wiring trench 410T is formed may be smaller than the second depth H2 at which the first upper wiring trench 410T is not formed. For example, the first depth H1 may range from 2 nm to 10 nm.

Figure 19:
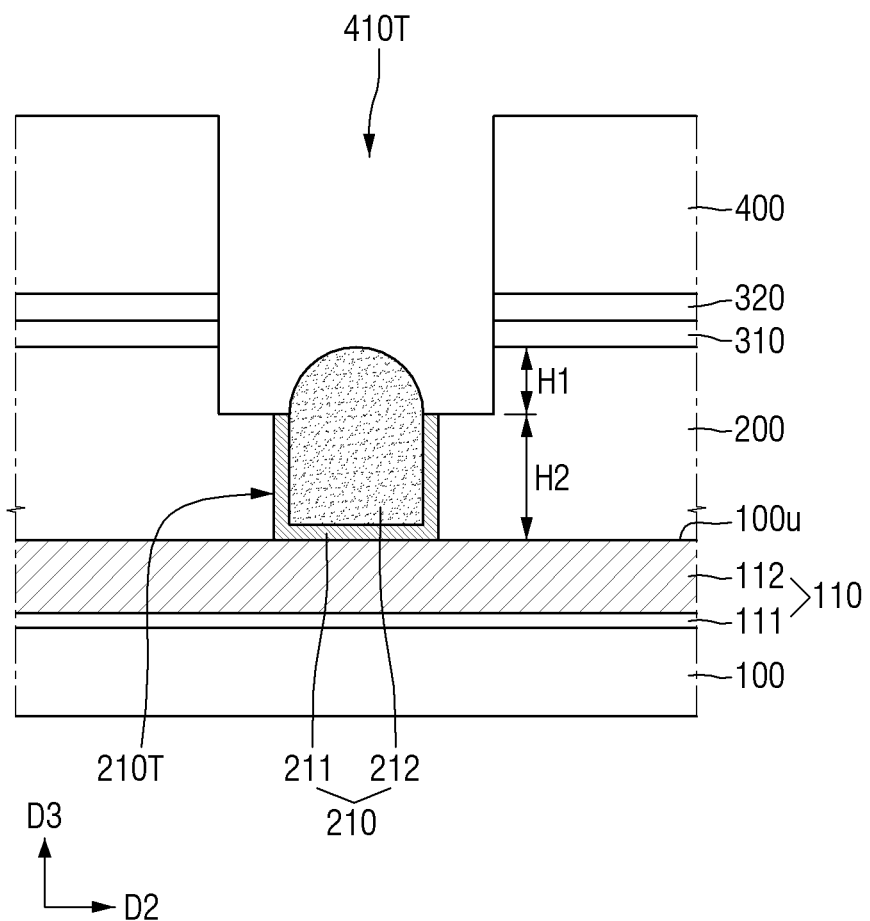

Referring to FIG. 19, the photo resist layer 490 (see FIG. 18) and the hard mask pattern may be removed using an etchant. The removal of the photo resist layer 490 and the hard mask pattern may be removed by performing a wet etching process or a dry etching process using an etching solution or an etching gas having a high etch selectivity with respect to the second insulation layer 400. The wet etching process may be performed using ammonia ($NH_3$)-based solution, for example, ammonium hydroxide ($NH_4OH$), or tetramethyl ammonium hydroxide (TMAH). The dry etching process may be performed using $CF4/O_2$ gas, or HBR gas.

Figure 20:
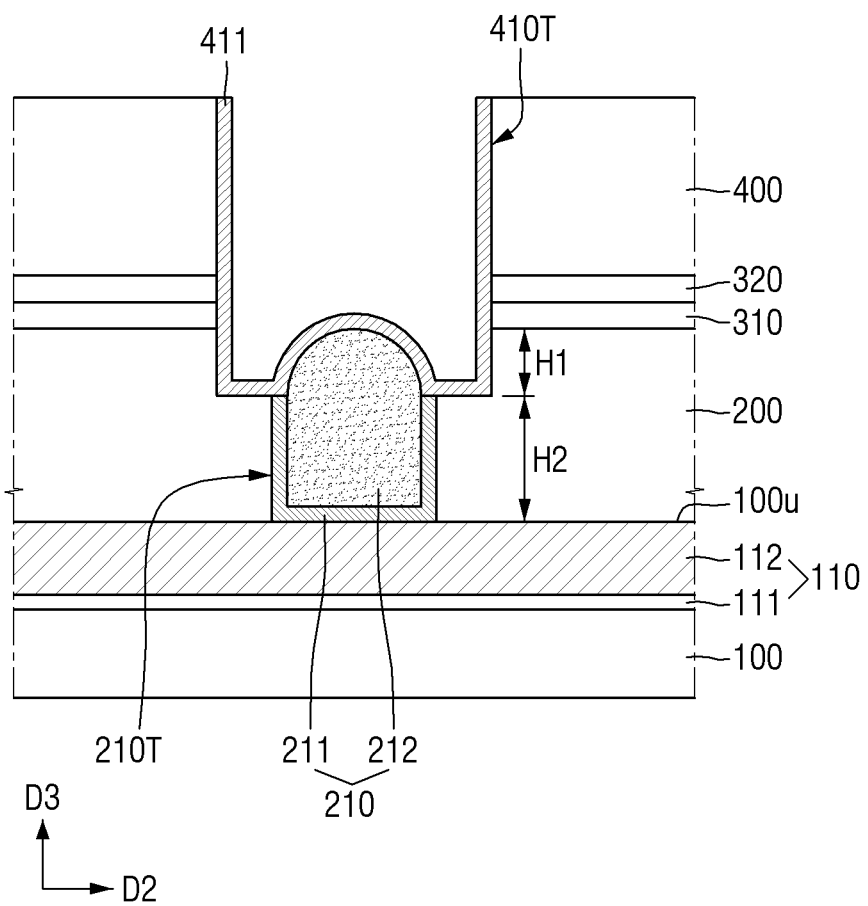

Referring to FIG. 20, the first upper wiring barrier film 411 is formed along an inner surface of the first upper wiring trench 410T.

Figure 21:
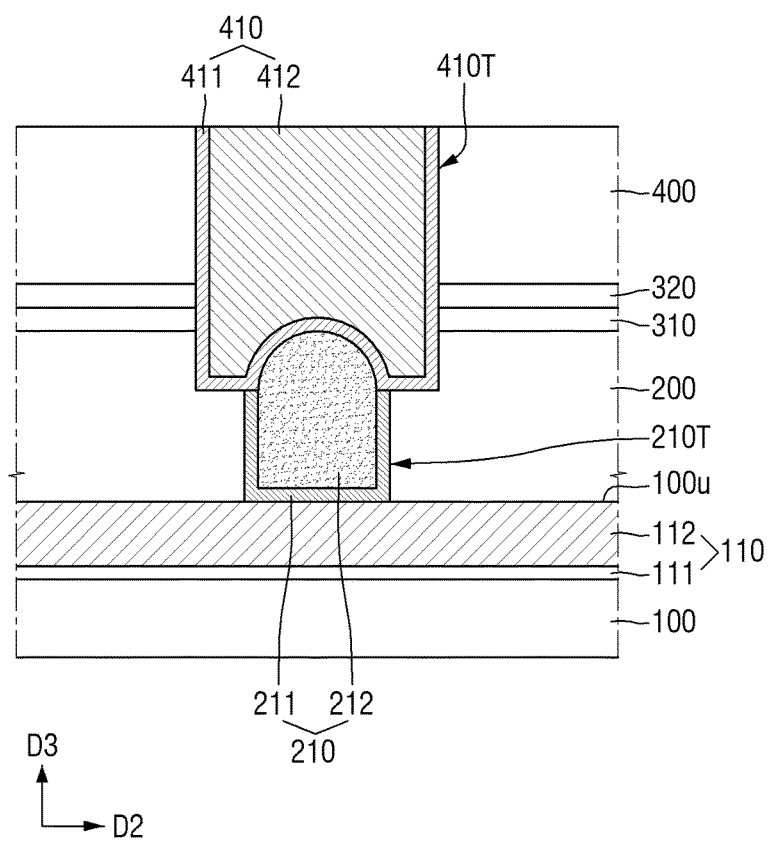

Referring to FIG. 21, the first upper wiring film 412 is formed in the first upper wiring trench 410T having the first upper wiring barrier film 411 and then a planarization process may be performed, such that the first upper wiring line 410 is formed. The planarization process may be performed, for example, by a chemical mechanical polishing process.

While the present inventive concepts have been particularly shown and described with reference to example embodiments thereof, it will be understood by those of ordinary skill in the art that various changes in form and details may be made therein without departing from the spirit and scope of the present disclosure as defined by the following claims.

Additionally, it will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

What is claimed is:

1. A semiconductor device comprising:
   a substrate;
   a first lower wiring line on the substrate;
   a first insulation layer on the first lower wiring line;
   a first dielectric barrier layer on the first insulation layer;
   a first etch stop layer on the first dielectric barrier layer;
   a second insulation layer on the first etch stop layer;
   a first upper wiring line extending through the second insulation layer, the first etch stop layer, and the first dielectric barrier layer; and
   a first conductive via in the first insulation layer and electrically connecting the first lower wiring line and the first upper wiring line,
   a second upper wiring line on the second insulation layer and spaced apart from the first upper wiring line;
   a third insulation layer on the second insulation layer;
   a second dielectric barrier layer on the third insulation layer;
   a second etch stop layer on the second dielectric barrier layer;
   a fourth insulation layer on the second etch stop layer;
   a third upper wiring line extending through the fourth insulation layer, the second etch stop layer, and the second dielectric barrier layer; and
   a second conductive via in the third insulation layer and connecting the second upper wiring line and the third upper wiring line,
   wherein an upper surface of the first conductive via protrudes above a lower surface of the first upper wiring line, and
   wherein an upper surface of the second conductive via protrudes above a lower surface of the third upper wiring line.

2. The semiconductor device of claim 1, wherein the first upper wiring line additionally extends into the first insulation layer.

3. The semiconductor device of claim 1, wherein the first dielectric barrier layer includes at least one of SiN, SiCN, SiOC, SiON, SiOCN, TiO, TaO, TaTiO, TaSiO and AlO.

4. The semiconductor device of claim 1, wherein the first etch stop layer includes at least one of AlOx, ZrOx, AlN and AlON.

5. The semiconductor device of claim 1, further comprising:
   a second lower wiring line spaced apart from the first lower wiring line.

6. The semiconductor device of claim 1, wherein a lowest surface of the first upper wiring line is lower than a lower surface of the first dielectric barrier layer.

7. The semiconductor device of claim 1, wherein the third upper wiring line additionally extends into the third insulation layer.

8. The semiconductor device of claim 1, wherein:
   the first upper wiring line includes a first upper wiring barrier film that contacts the first conductive via, and
   a portion of the first upper wiring barrier film is upwardly curved in a direction away from the substrate.

9. A semiconductor device, comprising
   a substrate;
   a first lower wiring line on the substrate;
   a first insulation layer on the first lower wiring line;
   a first dielectric barrier layer on the first insulation layer;
   a first etch stop layer on the first dielectric barrier layer;
   a second insulation layer on the first etch stop layer;
   a first upper wiring film and a first upper wiring barrier film surrounding the first upper wiring film, the first upper wiring film and the first upper wiring barrier film extending through the second insulation layer, the first etch stop layer, the first dielectric barrier layer, and at least part of the first insulation layer;
   a first via barrier film connected to the first upper wiring barrier film and in the first insulation layer, wherein a portion of the first upper wiring barrier film is upwardly curved in a direction away from the substrate,
   wherein the first dielectric barrier layer includes at least one of SiN, SiCN, SiOC, SiON, SiOCN, TiO, TaO, TaTiO, TaSiO and AlO, and the first etch stop layer includes at least one of AlOx, ZrOx, AlN and AlON;
   a third insulation layer on the second insulation layer;
   a second dielectric barrier layer on the third insulation layer;
   a second etch stop layer on the second dielectric barrier layer;
   a fourth insulation layer on the second etch stop layer;
   a second upper wiring barrier film extending through the fourth insulation layer, the second etch stop layer, the second dielectric barrier layer, and the third insulation layer; and
   a second via barrier film connected to the first upper wiring barrier film and in the third insulation layer,
   wherein a portion of the second upper wiring barrier film is upwardly curved in a direction away from the substrate.

10. The semiconductor device of claim 9, wherein
    the first upper wiring film and upper wiring barrier film do not extend into the first lower wiring line.

11. The semiconductor device of claim 9, further comprising:
    a third upper wiring barrier film in the second insulation layer, and spaced apart from the first upper wiring barrier film;
    a fourth upper wiring barrier film extending through the fourth insulation layer, the second etch stop layer, the second dielectric barrier layer, and the third insulation layer; and
    a third via barrier film in the third insulation layer,
    wherein a portion of the fourth upper wiring barrier film is upwardly curved in a direction away from the substrate.

12. The semiconductor device of claim 9, wherein:
a lowest surface of the first upper wiring barrier film is lower than a lower surface of the first dielectric barrier layer.

13. A semiconductor device comprising:
a substrate;
a first lower wiring line on the substrate;
a first insulation layer on the first lower wiring line;
a first dielectric barrier layer on the first insulation layer;
a first etch stop layer on the first dielectric barrier layer;
a second insulation layer on the first etch stop layer;
a first upper wiring line extending through the second insulation layer, the first etch stop layer, and the first dielectric barrier layer, and into the first insulation layer; and
a first conductive via in the first insulation layer and electrically connecting the first lower wiring line and the first upper wiring line,
wherein a portion of an upper surface of the first conductive via protrudes above a portion of a lower surface of the first upper wiring line, and
wherein the first upper wiring line extends into an upper half of the first insulation layer and does not extend to a lower half of the first insulation layer,
wherein a distance between a lowest surface of the first upper wiring line and an upper surface of the first insulation layer is a distance between 2 nm and 10 nm.

14. The semiconductor device of claim 13, wherein a lowest surface of the first upper wiring line is lower than a lower surface of the first dielectric barrier layer.

15. The semiconductor device of claim 13, wherein a portion of a lower surface of the first upper wiring line is upwardly curved in a direction away from the substrate.

* * * * *